United States Patent [19]

Dhong et al.

[11] Patent Number: 5,268,871

[45] Date of Patent: Dec. 7, 1993

[54] POWER SUPPLY TRACKING REGULATOR FOR A MEMORY ARRAY

[75] Inventors: Sang H. Dhong; Hyun J. Shin, both of Mahopac; Wei Hwang, Armonk, all of N.Y.

[73] Assignee: International Business Machines Corporation, Armonk, N.Y.

[21] Appl. No.: 771,295

[22] Filed: Oct. 3, 1991

[51] Int. Cl.⁵ .............................................. G11C 13/00
[52] U.S. Cl. ................................. 365/226; 307/296.1; 307/296.5; 307/296.6; 365/189.09; 365/189.11; 365/189.07; 365/204
[58] Field of Search ...................... 365/189.09, 189.11, 365/230, 189.07, 204; 307/296.6, 296.7, 296.1, 296.5

[56] References Cited

U.S. PATENT DOCUMENTS

| | | | |
|---|---|---|---|
| 4,099,264 | 6/1978 | Lodi | 365/189.09 |
| 4,581,564 | 4/1986 | Gassler | 315/403 |
| 4,638,464 | 1/1987 | Cranford, Jr. et al. | 365/226 |
| 4,670,861 | 6/1987 | Shu et al. | 365/181 |
| 4,739,191 | 4/1988 | Puar | 307/297 |
| 4,742,250 | 5/1988 | Tobita | 307/296 R |
| 4,794,278 | 12/1988 | Vajdic | 307/297 |
| 4,825,142 | 4/1989 | Wang | 323/314 |
| 4,843,256 | 6/1989 | Scade et al. | 307/296.2 |
| 4,883,976 | 11/1989 | Deane | 307/291.2 |
| 4,890,011 | 12/1989 | Miyatake | 307/296.2 |
| 4,906,863 | 3/1990 | Van Tran | 307/296.7 |
| 4,961,007 | 10/1990 | Kumanoya et al. | 307/296.2 |
| 5,154,260 | 10/1992 | Yoh et al. | 307/296.6 |
| 5,168,174 | 12/1992 | Naso et al. | 307/296.6 |

OTHER PUBLICATIONS

Horiguchi et al., "A Tunable CMOS-DRAM Voltage Limiter With Stabilized Feedback Amplifier", IEEE, pp. 75-76, Jun. 1990.

*Primary Examiner*—Eugene R. LaRoche
*Assistant Examiner*—Vu A. Le
*Attorney, Agent, or Firm*—Heslin & Rothenberg

[57] ABSTRACT

A voltage regulator is provided for controlling an on-chip voltage generator which produces a boost voltage across a charge reservoir for supply to one input of a plurality of word line drivers in a memory array. The regulator is configured such that the charge reservoir voltage will track the power supply voltage and the difference between the power supply voltage and the charge reservoir voltage will be maintained substantially constant over a predefined power supply range. The voltage regulator includes a bandgap reference generator, a first differential circuit for producing a transition voltage from the reference voltage and the power supply voltage, a first transistor for comparing the power supply voltage with the boost voltage, a second transistor for comparing the transition voltage with the reference voltage and a latching comparator for equating the signal outputs from the first and second transistors so as to define a control signal for the on-chip voltage generator. Along with further specific details of the voltage regulator, a preferred bandgap reference generator is described.

11 Claims, 5 Drawing Sheets fig. 1
PRIOR ART fig. 1a fig. 2 fig. 3 fig. 4

5,268,871

POWER SUPPLY TRACKING REGULATOR FOR A MEMORY ARRAY

BACKGROUND OF INVENTION

Technical Field

The invention relates generally to semiconductor integrated circuit memory devices and, in particular, to a voltage regulator for controllably adjusting an on-chip generated voltage in response to changes in an external power supply voltage, both voltages comprising inputs to the word line drivers of a memory array. The invention also relates to bandgap reference generators for CMOS devices.

Background Art

Figure 1:
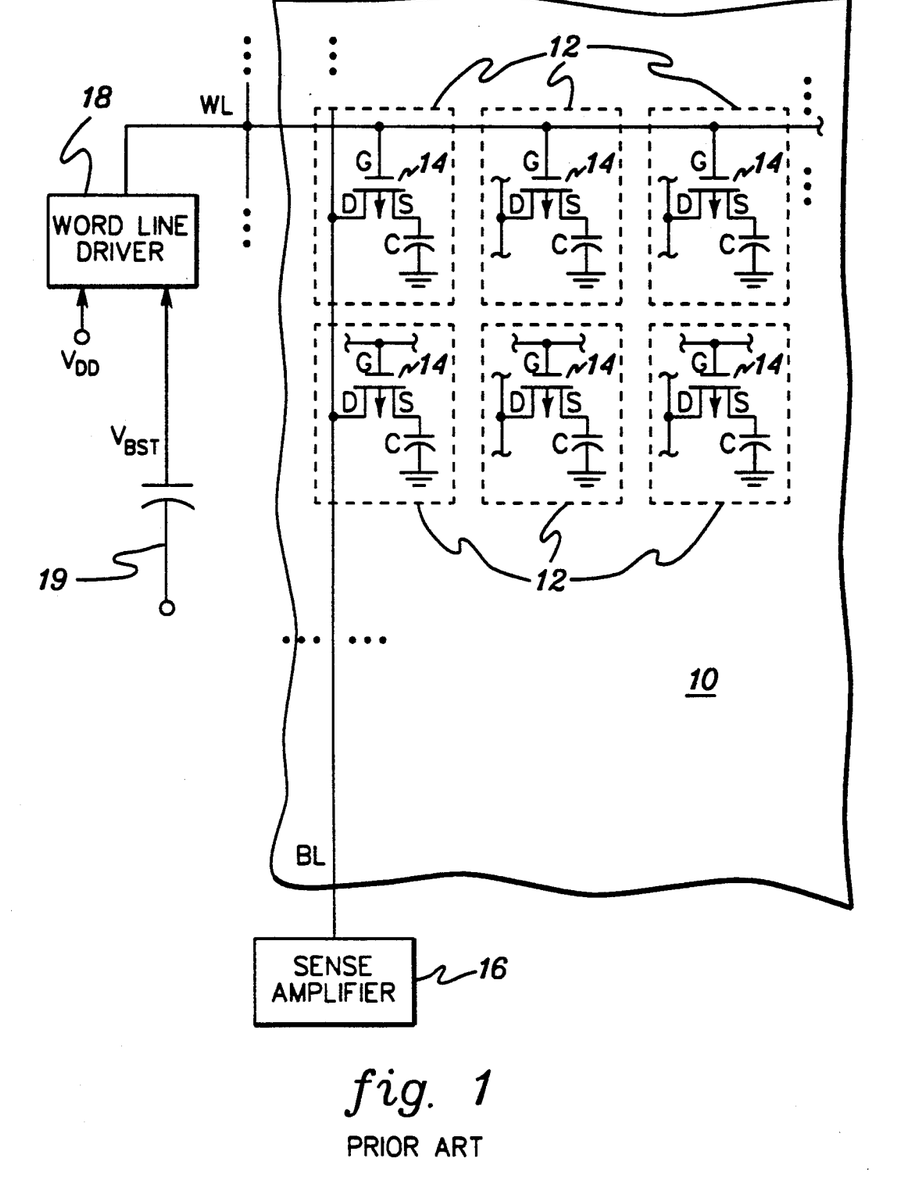
FIG. 1 is a partial schematic of a conventional DRAM structure.

Dynamic type semiconductor- memory devices (DRAMs) are well known. A partial block diagram of a DRAM structure is shown in FIG. 1. The structure comprises a memory array 10 including a plurality of memory cells 12 which function as the memory elements. In this embodiment, each memory cell 12 includes a PFET 14 having its source "S" coupled to a first terminal of a capacitor "C", the second terminal of which is connected to ground. Each row of the plurality of memory cell rows is connected to a word line "WL" through the gate "G" of the respective PFETs 14. Each memory cell is also connected to a bit line "BL" through drain "D" of PFETs 14. The intersections of the word lines are connected to a row decoder (not shown) and the bit lines are connected to a column decoder (not shown). These word lines and bit lines form a matrix definitive of a memory array.

Upon receipt of an externally applied row address signal and column address signal, a particular memory cell is selected which is at the intersection of the word line and the bit line selected by the row decoder and the column decoder, respectively, and the information is read from or written into the memory cell through an input/output interface portion including a sense amplifier 16 connected to the selected bit line and through any input/output buffer. For further specific details on the operation of DRAM structures, U.S. Pat. No. 3,940,747 entitled "High Density, High Speed Random Access Read—Write Memory" can be referred to.

More specific to the invention presented herein, each word line "WL" is connected to a word line driver 18, which selects between one of two voltage levels, such as a first, externally provided power supply voltage $V_{DD}$ and a second, on-chip generated boost voltage $V_{BST}$. For the PMOS transistor memory array configuration depicted, boost voltage $V_{BST}$ comprises a negative voltage and is used by word line driver 18 to select the corresponding word line as directed by the row decoder (not shown). Power supply voltage $V_{DD}$ comprises a positive voltage and, with present MOS technology, is typically rated in the range of 2.8-3.3 volts. A negative boost voltage $V_{BST}$ is desirable to insure the complete discharging of the memory cell capacitors "C" in the selected word line "WL". (Grounding of the selected PFETs would only reduce the cell capacitive voltage to the threshold voltage of the PFETs.) A typical negative boost voltage $V_{BST}$ is $-1$ to $-2$ volts. Because of power requirements, the boost voltage $V_{BST}$ normally resides across a capacitor 19.

The present invention overcomes the deficiencies of previously known circuitry for providing an on-chip generated boost voltage $V_{BST}$. In particular, the present invention provides a regulator which relieves the electric field on the thin oxide of the word line drivers and related circuits without adversely affecting the worst-case memory array response times.

DISCLOSURE OF INVENTION

Briefly described, in one aspect of the present invention, voltage supply circuitry is provided for powering a plurality of word line drivers of a memory array. Each driver has a first input and a second input. The voltage supply circuitry includes first supply means for providing a first voltage to the first inputs of the plurality of word line drivers and second supply means for supplying a second voltage to the second inputs of the word line drivers. In addition, a regulator is provided for regulating the second voltage supplying means such that the voltage difference between the first voltage and the second voltage supplied to the word line drivers is substantially constant over a predefined first voltage range irrespective of fluctuations in said first voltage. As a specific implementation, the memory array comprises a DRAM structure and the second voltage supplying means includes a charge reservoir, wherein the charge across the reservoir comprises the second voltage, and a charge generator coupled to the charge reservoir. The charge generator operates to charge/discharge the reservoir under control of the regulating means.

In another aspect of the present invention, a circuit is provided for generating and supplying a second one of two voltages supplied to the word line drivers of a memory array, the first voltage supplied being an external power supply voltage. The circuit includes generating means which controllably generate a second voltage relative to the power supply voltage such that the maximum stress field across the word line drivers due to the difference between the power supply voltage and the generated voltage is substantially constant. In addition, supplying means provide the controllably generated voltage to the second voltage input of the word line drivers.

In a more specific embodiment, the present invention provides a voltage regulator for controlling an on-chip voltage generator which produces a boost voltage $V_{BST}$ for supply to a second input of a plurality of word line drivers in a memory array. Each of the word line drivers also has a first input for receiving a power supply voltage $V_{DD}$. The on-chip voltage regulator includes a reference voltage $V_{REF}$ generator and a first differential means for producing a transition voltage $V_X$ from the reference $V_{REF}$ and the power supply voltage $V_{DD}$, the transition voltage being proportional to fluctuations in the power supply voltage. First transistor means compares the power supply voltage $V_{DD}$ with the voltage at node B and second transistor means compares the transition voltage $V_X$ with the reference voltage $V_{REF}$. The comparisons from both the first and second transistor means are fed to a latching comparator which equates the two inputs and outputs a boost voltage control signal to the on-chip voltage generator. The control signal being such that the boost voltage output from the generator is defined by:

$$V_{BST} = -V_{BASE} + V_{DD} - V_X.$$

Further specific details of the voltage regulator are also provided and claimed.

In yet another aspect, the present invention comprises a bandgap voltage reference generator having a heavily doped N-type polysilicon PMOS transistor and a heavily doped P-type polysilicon PMOS transistor. Each heavily doped PMOS transistor is connected in diode configuration, with the drain and gate of the heavily doped N-type transistor coupled to ground potential and the sources of both transistors connected together. The generator further includes at least one PMOS transistor disposed between the commonly connected sources of the heavily doped polysilicon PMOS transistors and a circuit power supply voltage. A first current source is coupled to the gate of the at least one PMOS transistor for controlling the voltage across the coupled heavily doped polysilicon PMOS transistors. An NMOS transistor is disposed between the coupled gate and drain of the heavily doped P-type polysilicon PMOS transistor and ground potential. Lastly, a second current source is coupled to the gate of the NMOS transistor for controlling the voltage level at the coupled gate and drain of the heavily doped P-type polysilicon PMOS transistor. The reference voltage to be output from the generator comprises the voltage at the coupled gate and drain of the heavily doped P-type polysilicon PMOS transistor.

The charge pump regulator described herein enables the charge reservoir voltage supplied to the word line drivers of a memory array to track the power supply voltage such that the difference between the power supply voltage and the charge reservoir voltage is maintained substantially constant notwithstanding power supply, temperature and other process variations. By maintaining the voltage difference substantially constant, the worst-case stress voltage across the word line drivers and associated circuitry is controlled and the worst-case timing response is lower than can be accomplished with previous regulating techniques. Since chip yield is dependent on worst-case numbers, the charge pump regulator presented herewith will also improve circuit yield. The regulation concepts provided can be applied to DRAM chips with NMOS access-transistor cells.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Figure 1A:
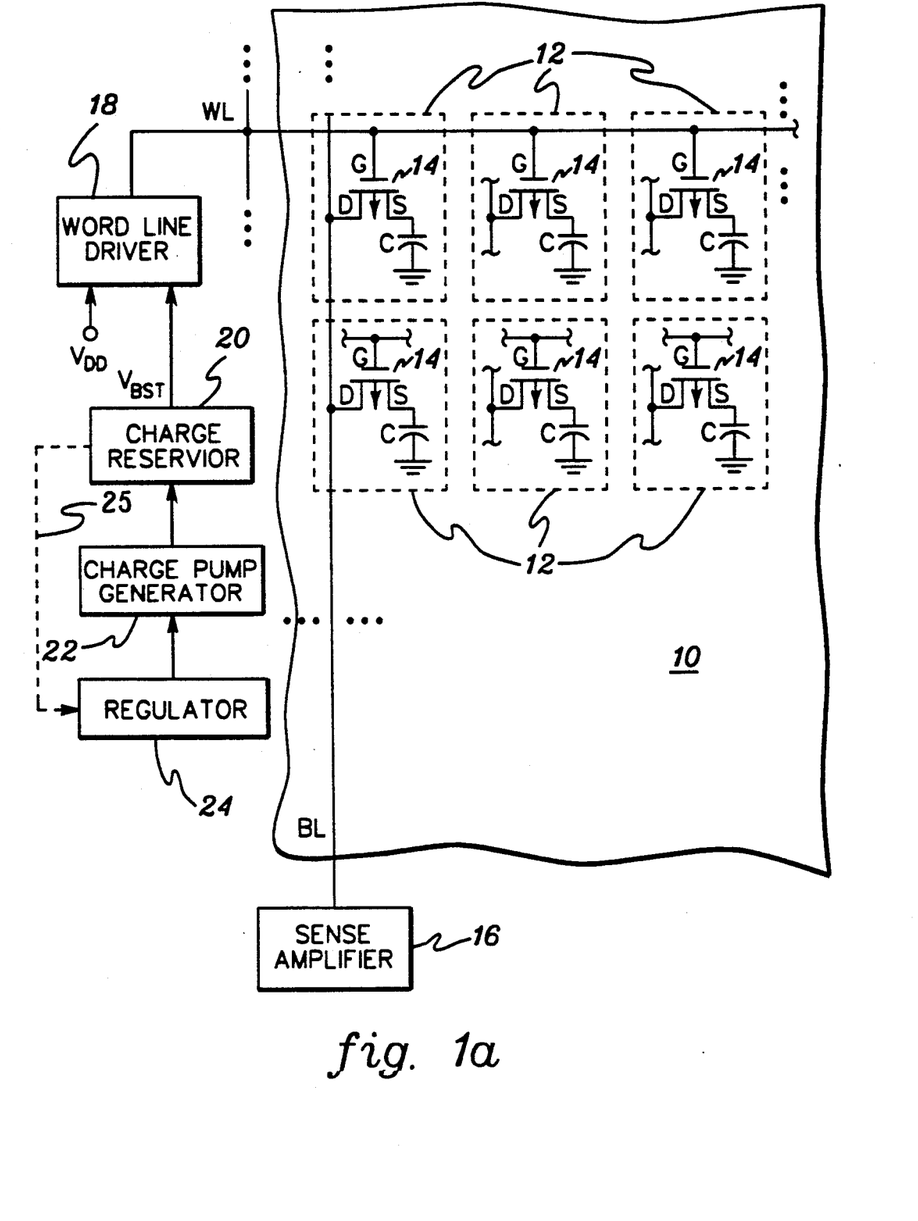
FIG. 1a is a partial schematic of a DRAM structure, in accordance with the principles of the present invention.

In accordance with the principles of the present invention, in one embodiment, the boost voltage $V_{BST}$ resides across a charge reservoir 20 (FIG. 1a), which is controlled by a charge pump generator 22 residing on-chip. (Similar components of FIGS. 1 and 1a are described previously with reference to FIG. 1.) A regulator 24 controls generator 22. Without employing the principles of the present invention, regulator 24 controls generator 22 so that the boost voltage $V_{BST}$ either increases in negative voltage as the external power supply voltage $V_{DD}$ increases, or alternatively, remains constant as the external power supply voltage $V_{DD}$ increases. Both approaches create reliability/hot-electron concerns, especially with high power supply $V_{DD}$ values. For example, a reservoir voltage of $-1.5$ volts with a power supply voltage $V_{DD}$ of 2.8 volts produces a moderate 4.3 volts stress voltage across the word line drivers and related circuits. However, if the reservoir voltage is maintained at $-1.5$ volts, a 3.6 volt power supply $V_{DD}$ creates a stress voltage of 5.1 volts. This increase is significant and can cause serious device degradation and reliability problems.

The present invention provides in one important implementation a voltage regulator for controlling the on-chip voltage generator which supplies the boost voltage $V_{BST}$ to the word line drivers of a DRAM structure. Pursuant to the invention, the voltage regulator is configured to enable the charge reservoir voltage to track the power supply voltage $V_{DD}$ such that the difference between the power supply voltage $V_{DD}$ and the charge reservoir voltage $V_{BST}$ is maintained substantially constant, notwithstanding power supply $V_{DD}$, temperature and/or process variations. By way of example, a typical reservoir voltage $V_{BST}$ of $-1.75$ V could be supplied to the word line drivers when the power supply voltage $V_{DD}$ is rated at 2.8 V. However, due to power supply variations, if voltage $V_{DD}$ increases to 3.6 V then pursuant to the invention the reservoir voltage $V_{BST}$ will automatically adjust to $-1.0$ V. Note that with such an adjustment the worst case stress voltage across the word line drivers and their associated circuitry remains at approximately 4.6 V, which is a result clearly superior to that produced by the prior art voltage regulating approaches described above.

Although described herein with reference to a DRAM structure having PMOS memory cells, the concept of maintaining the voltage difference between the power voltage $V_{DD}$ and the charge reservoir voltage $V_{BST}$ substantially constant in order to decrease the worst case stress voltage across the word line drivers is also equally applicable to DRAM chips with NMOS access-transistor cells using circuitry similar to that described herein.

Also, a strict linear dependence of the reservoir voltage $V_{BST}$ on the power supply voltage $V_{DD}$ is not necessarily optimal, especially for low power supply voltages. This is because the capability of the charge pumping circuit 22 (FIG. 1a) diminishes with lower power supply voltage $V_{DD}$ and it becomes difficult for the circuit to maintain the higher reservoir voltage $V_{BST}$ required by a linear relation. This in turn could cause premature timing fall-out. Using the above example, with a strictly linear dependence the pump regulator will attempt to maintain $-2.2$ V across the reservoir for a power supply value of 2.4 V. This may be beyond the capability of the pump generator and could therefore cause the chip to fail. Even though 2.4 V is below the normal power supply $V_{DD}$ operating range, it is believed better for the reservoir voltage to be independent of the power supply voltage should voltage $V_{DD}$ pass below some lower predefined value. Thus, an optimally designed pump regulator pursuant to the present invention should have a transition point in its reservoir voltage $V_{BST}$ vs. power supply voltage $V_{DD}$ characteristic.

Figure 2:
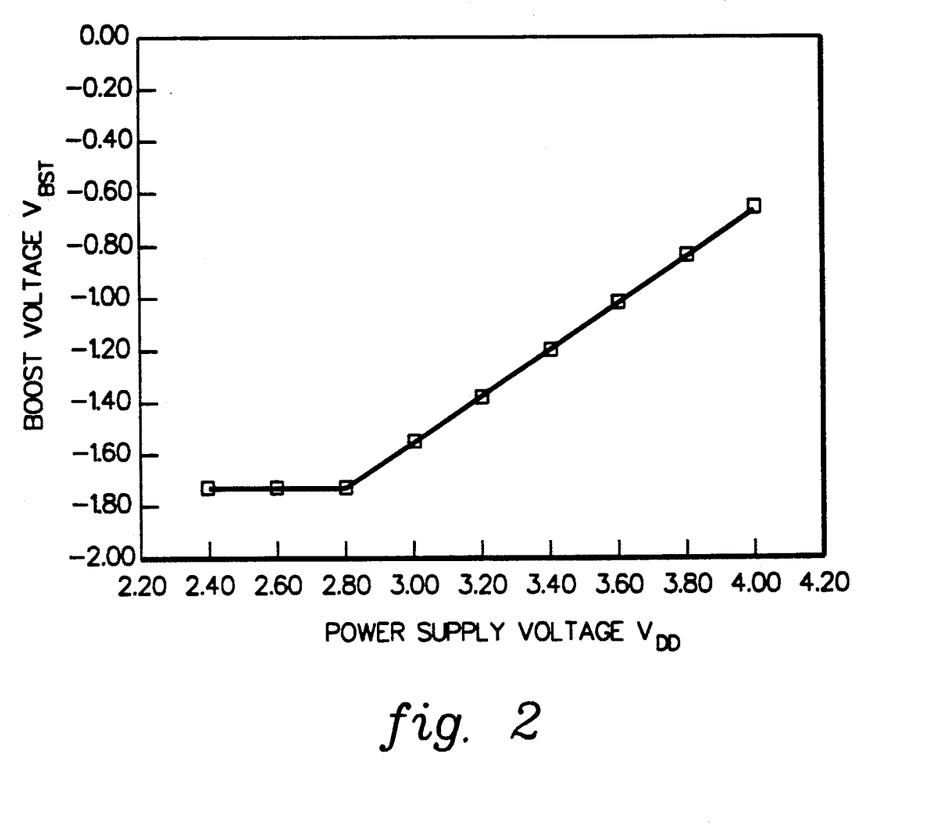
FIG. 2 is a graphical representation of the boost voltage $V_{BST}$ vs. power supply voltage $V_{DD}$ characteristic.

The preferred voltage characteristic is depicted in the graph of FIG. 2. As shown, with power supply voltage lower than the transition point (herein 2.8 V) there is no reservoir voltage $V_{BST}$ dependence on $V_{DD}$; however, for a higher power supply voltage (e.g., 2.8-4.0 V), a linear dependence on $V_{DD}$ exists. The power supply voltage at the transition point (i.e., 2.8 V) is referred to herein as the transition voltage $V_X$. This voltage in combination with the power supply voltage defines the boost voltage $V_{BST}$ required to maintain linear dependence between the boost voltage $V_{BST}$ and the power supply voltage $V_{DD}$. The voltage level at which the boost voltage $V_{BST}$ is constant is defined herein as the base voltage $V_{BASE}$, which in the simulation depicted equals $-1.7$ V.

The preferred reservoir voltage $V_{BST}$ vs. power supply voltage $V_{DD}$ control characteristic of a pump regulator can be expressed as follows:

$$V_{BST} = -V_{BASE} + V_{DD} - V_X \qquad (1)$$

wherein:
- $V_{BASE}$ = the constant reservoir voltage below the transition point,
- $V_X$ = the transition voltage offset needed to maintain linear dependence between $V_{BST}$ and $V_{DD}$.

Figure 3:
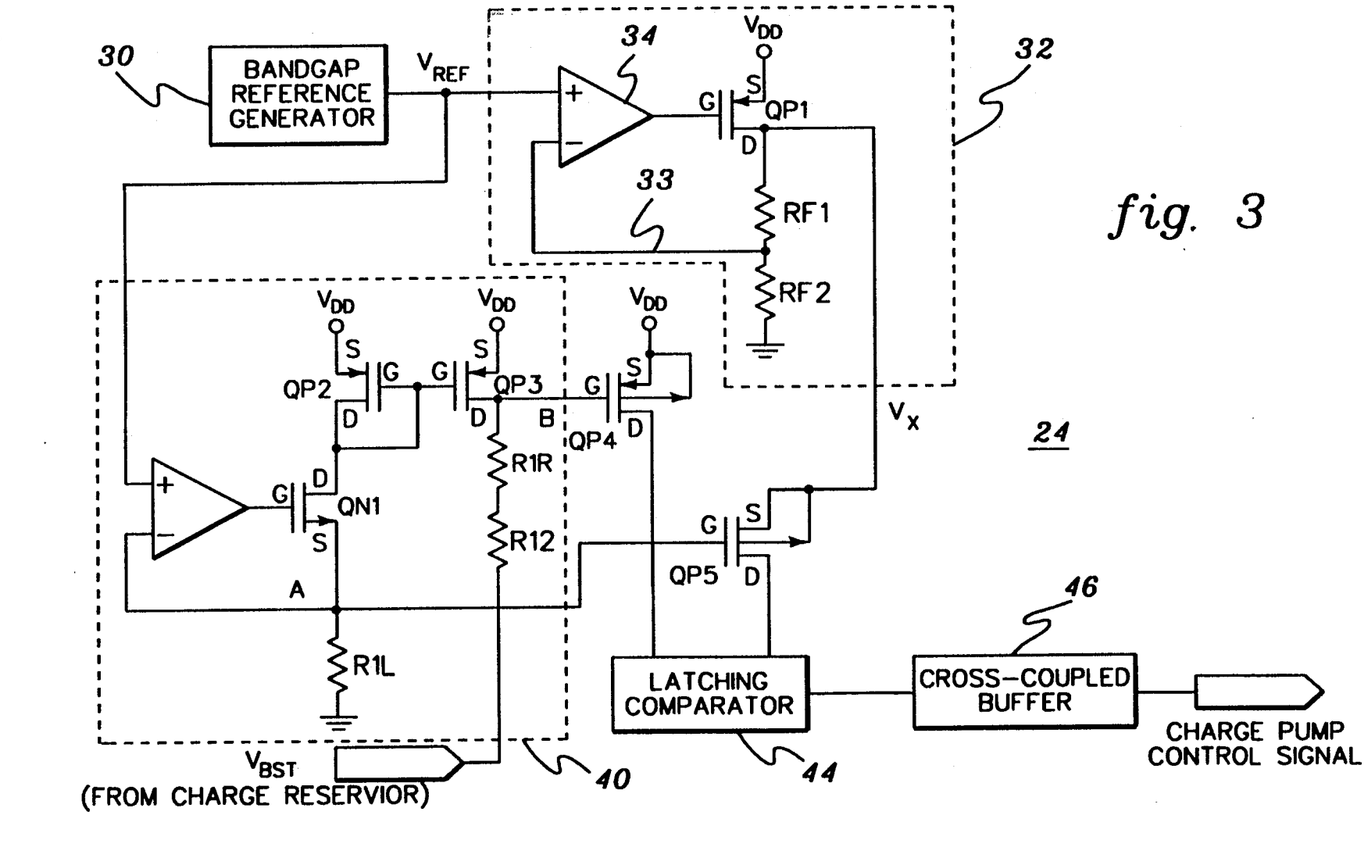
FIG. 3 is a schematic of one embodiment of the regulator of the present invention.

One preferred circuit implementation of equation (1) is depicted in FIG. 3 which is described in detail below.

FIG. 3 depicts one embodiment of an on-chip voltage generator regulator 24 implemented pursuant to the present invention. Regulator 24 utilizes a bandgap reference generator 30 to produce a stable reference voltage $V_{REF}$ as a function of power supply voltage $V_{DD}$ and temperature. A typical reference voltage output from generator 30 would be 1.1 to 1.2 V. (A threshold voltage reference generator could alternatively be substituted for the bandgap reference generator; however, generator 30 is believed preferable.) One particularly novel implementation of a bandgap reference generator is described below with reference to FIG. 4. The generator depicted therein has a wider operating range than most previously known bandgap reference generators. Again, however, any generator which functions to provide a reference point for voltage regulator 24 could be employed.

The reference voltage $V_{REF}$ is input to a transition voltage ($V_X$) generating circuit 32 which includes a first differential amplifier 34 and associated circuitry. The reference voltage $V_{REF}$ is received at a first, "+" input to amplifier 34. The output of amplifier 34 is fed to the gate "G" of a PFET QP1, which has its source "S" connected to the power supply voltage $V_{DD}$. The drain "D" of PFET QP1 contains the transition voltage $V_X$ to be output from circuit 32. A feedback circuit is also coupled between the drain "D" of transistor QP1 and a second, "−" input to amplifier 34. The feedback circuit includes a first resistor RF1 in series with a second resistor RF2, which has its other terminal connected to ground. A feedback connection 33 couples the common terminals of resistors RF1 and RF2 to the negative input of amplifier 34. A typical resistor value for RF1 would be 160 k ohms and for RF2 120 k ohms. With these values, one possible transition on voltage $V_X$ is approximately 2.8 V. Since resistors RF1 and RF2 have the same temperature dependence, transition voltage $V_X$ will have the same temperature dependence as the reference voltage $V_{REF}$.

Regulator 24 also preferably includes a constant current, temperature compensated, voltage level shifting circuit 40 which receives as a first input the reference voltage $V_{REF}$m at a first, "+" terminal to a differential amplifier 42. The output of amplifier 42 is tied to the gate "G" of an NFET QN1, which has its source "S" coupled to a second, "−" input to amplifier 42. The source "S" of NFET QN1 is also tied to ground across a resistor R1L. This differential amplifier configuration ensures that the voltage at the source of transistor QN1, i.e., node A, will be identical to the reference voltage $V_{REF}$ (e.g., 1.2 V) output from generator 30.

Continuing with voltage level shifting circuit 40, the drain "D" of NFET QN1 is tied to the gates "G" of two identical PFETs QP2 and QP3, each source "S" of which is tied to the power supply voltage $V_{DD}$. The drain "D" of PFET QP2 is tied to the drain "D" of NFET QN1, which as noted, is also connected to the gates "G" of PFETs QP2 and QP3. The drain "D" of PFET QP3 is tied to one terminal of two series connected resistors R1R and R12, the opposite terminal of which is coupled to receive the unshifted boost voltage $V_{BST}$ output from generator 20 (FIG 1a) via a feedback loop 25 (shown in phantom). Since PFETs QP2 and QP3 are identical, the same current will flow through resistor R1L and series connected resistors R1R and R12. Preferably, R1L and R1R will have the same value (e.g., R1L = R1R = 60 k ohms, while R12 = 85 k ohms). With this configuration, resistors R1R and R12 will shift the boost voltage $V_{BST}$ by $V_{REF} \cdot (1 + R12/R1L)$ in the positive direction. Thus, the voltage at node B, i.e., drain "D" of PFET QP3, is $V_{BST} + V_{REF}(1 + R12/R1L)$. The level shifting voltage is generated by the resistor ratios from the reference voltage $V_{REF}$m and have the same temperature dependence as the reference voltage.

The voltage at node B is applied to the gate "G" of a PFET QP4, which has its source "S" and N-well connected to power supply voltage $V_{DD}$. The drain "D" of PFET QP4 is connected to a first input of a conventional latching comparator 44. The reference voltage $V_{REF}$ at node A is input to a gate "G" of a PFET QP5, which also has its N-well tied to its source "S". In this case, the source "S" receives the transition voltage $V_X$ and the drain "D" of PFET QP5 is tied to a second input of latching comparator 44. The current through PFET QP4 is determined by the voltage difference between node B and the power supply voltage $V_{DD}$, while for PFET QP5 the current is determined by the voltage difference between the voltage at node A ($V_{REF}$) and the transition voltage $V_X$. Since the latching comparator compares (i.e., equates) the currents through PFETs QP4 and QP5, the equality of equation (2) exists.

$$V_{DD} - V_{BST} - V_{REF}\left(1 + \frac{R12}{R1L}\right) = V_X - V_{REF} \qquad (2)$$

rearranging equation (2) produces equation (3)

$$V_{BST} = -V_{REF}\left(\frac{R12}{R1L}\right) + V_{DD} - V_X \qquad (3)$$

Equation (3) can be further rewritten as equation (4)

$$V_{BST} = -V_{BASE} + V_{DD} - V_X \qquad (4)$$

wherein: $V_{BASE} = V_{REF}(R12/R1L)$

Note that the base voltage $V_{BASE}$ can be changed by changing the ratio of resistors R12 to R1L. Although it is possible not to level shift $V_{BST}$, better performance is believed obtained by level shifting. The output of latching comparator 44 after passing through a cross-coupled buffer 46 is output from regulator circuit 24 as a charge pump control signal which is fed to generator 22 (FIG. 1a).

It will be observed from the above description that pump regulator 24 enables the charge reservoir voltage to track the power supply voltage $V_{DD}$ such that the difference between the power supply $V_{DD}$ and the charge reservoir voltage $V_{BST}$ is maintained substantially constant irrespective of power supply, temperature and/or other process variations. Further, in the preferred embodiment depicted, a base voltage $V_{BASE}$ is defined at a transition point below which the boost voltage is maintained constant independent of the power supply voltage $V_{DD}$.

Figure 4:
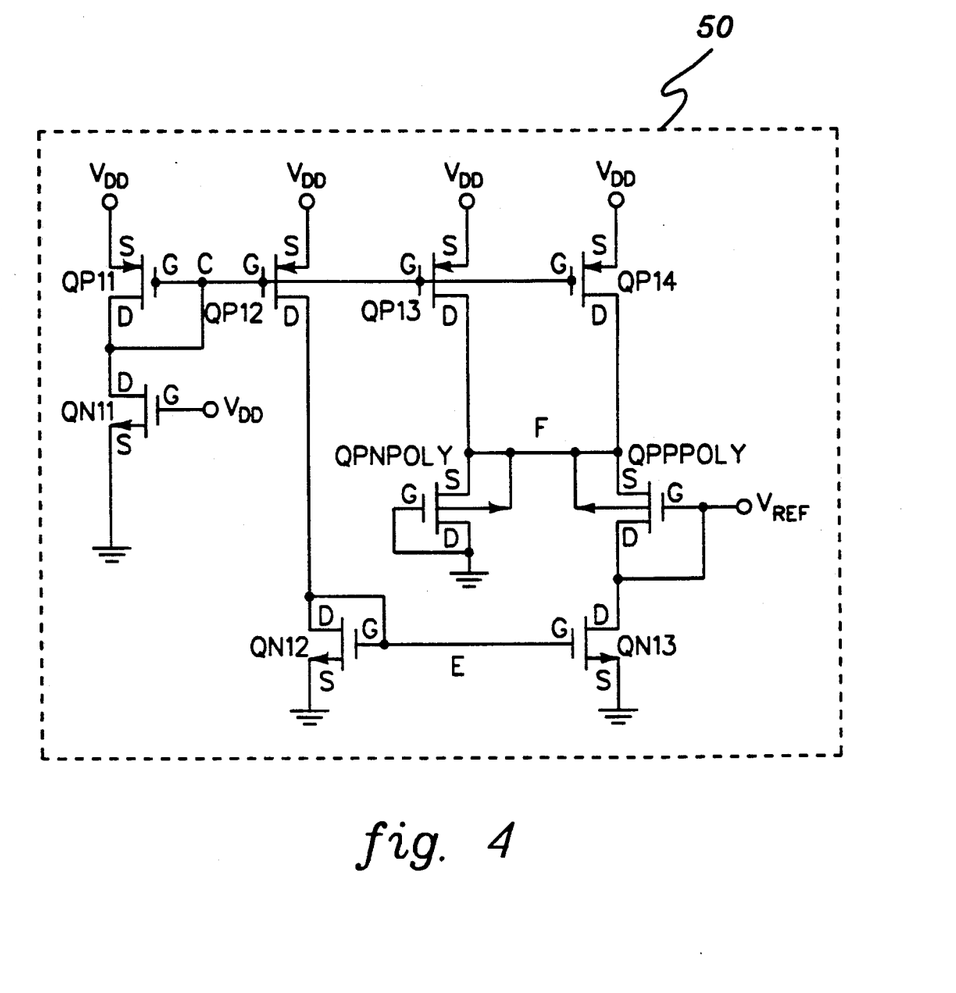
FIG. 4 is a detailed schematic of one embodiment of the reference voltage generator of FIG. 2.

As noted above, one novel implementation for a bandgap reference generator is depicted in FIG. 4. This circuit is preferably employed by the regulator of FIG. 3 since a wider voltage operating range than most, if not all, previous bandgap reference generators is obtained. The operating window is enlarged essentially by the value of the threshold voltage of the transistors used therein. For example, in a typical reference generator application, the power supply $V_{DD}$ may be rated at 3 V. In many prior art devices, a voltage variation to 2.5 V would render the reference circuit inoperative. However, with a bandgap reference generator such as generator 50 depicted in FIG. 4, the range of operation of the circuit is increased by approximately 0.7 V, which in turn increases the operating window by 20% or more.

The application described herein, however, is only one of a number of possible uses for a bandgap reference generator. For example, almost all CMOS chips require a reference generator as part of an on-chip voltage regulator. The more accurate the on-chip generator is over a wider operating range (i.e., under temperature, power supply and process variations) the better the circuit. Enhanced performance is obtained by generator 50 through a separation of the current sources to PFETs QP13 & QP14 and NFET QN13. The connecting of these transistors into separate branches provides the overall wider power supply $V_{DD}$ variation operating range.

Referring specifically to FIG. 4, power supply voltage $V_{DD}$ is tied to each source "S" of four PFETs, namely QP11, QP12, QP13 and QP14. The gate "G" of each of these PFETs is tied to the drain "D" of an NFET QN11, which is gated "G" by the power supply $V_{DD}$ and has its source "S" tied to ground. PFET QP11 also has its drain "D" tied to the drain "D" of NFET QN11. Transistor QP11 further has its N-well connected to its source "S", which as noted is connected to power supply voltage $V_{DD}$. This configuration is essentially a diode configuration with the transistor's gate and drain connected together. Together with NFET QN11, transistor QP11 forms one lag of the current source (i.e., provides one dc current path from the power supply voltage $V_{DD}$ to ground). The voltage at node C will be slightly higher than the threshold voltage of PFET QP11. Preferably, transistor QN11 is very small in comparison with transistor QP11 such that with an equal amount of current flowing through the transistors, transistor QP11 will only partially be on while transistor QN11 will be fully on. Typical width/length gate ratios for the QP11 and QN11 transistors would be 100/2 and 5/100, respectively.

As noted, the voltage at node C is also applied to PFET QP12. This transistor has its drain "D" tied to the drain "D" of NFET QN12, which is also tied in a diode configuration such that any voltage at the drain is applied to its gate "G" (i.e., node E). The source "S" of transistor QN12 is tied to ground. Together, transistors QP12 and QN12 define another current path which carries the same amount of current as the current path defined by transistors QP11 and QN11. Again, these transistors are sized such that the current through transistor QP12 will only slightly turn on transistor QN12. The current within this current path is defined by the voltage between the power source $V_{DD}$ and node C, which will be copied and force the current path from VDD to ground through this lag to have the same current flowing therethrough. The voltage between gate "G" and ground across transistor QN12 is copied to the gate "G" of an NFET QN13, which also has its source "S" tied to ground. This connection ensures that the current lag from power supply $V_{DD}$ through transistor QP14 and transistor QPPPOLY will have the same amount of current as the other current lags. In this lag, the drain "D" of NFET QN13 is tied to the drain "D" of QPPPOLY (i.e., a heavily doped P-type polysilicon PMOS transistor), and also to its gate "G". The output of generator 50, i.e., the reference voltage $V_{REF}$, is taken at the gate "G" to QPPPOLY. The N-well of transistor QPPPOLY is connected to the transistor's source "S", which is also coupled to the drain "D" of transistor QP14. The voltage at node F is also applied to the drain "D" and N-well of a transistor QPNPOLY (a heavily doped N-type polysilicon PMOS transistor), which has its gate "G" and source "S" tied to ground. The drain "D" of PFET QP13 is also tied to node F.

The reference voltage $V_{REF}$ is derived by comparing the threshold voltages of the PMOS devices with P+POLY and N+POLY, which is readily available for today's CMOS technology. The temperature dependence of the silicon bandgap is approximately $-4.73 \times 10^{-4}/°$ C. and the reference voltage will change less than 50 mV from 25° C. to 85° C. In the voltage regulator embodiment described initially, the bandgap reference voltage $V_{REF}$ is beneficially employed to generate the transition voltage $V_X$ and the constant level-shifting voltage, including the base voltage $V_{BASE}$.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. Voltage supply circuitry for a plurality of word line drivers of a memory array, each driver being connected so as to control one of a plurality of word lines in said array, and each of said drivers having a first input and a second input, said voltage supply circuitry including:

first means for supplying a first voltage to said first inputs of said plurality of word line drivers;

second means for supplying a second voltage to said second inputs of said word line drivers; and means for regulating said second voltage supplying means such that a voltage difference between said first voltage and said second voltage supplied to said word line drivers is substantially constant when said first voltage changes above a predefined transition point.

2. The voltage supply circuitry of claim 1, wherein said second voltage supplying means includes:

a charge reservoir, a charge across said reservoir comprising said second voltage supplied to said second inputs of said word line drivers; and a charge generator coupled to said charge reservoir, said charge generator operating a perform one of a charge and discharge of said reservoir under control of said regulating means, said charging and discharging being so as to maintain said constant voltage difference between said first voltage and said second voltage as said first voltage changes above said predefined transition point.

3. The voltage supply circuitry of claim 2, wherein said memory array comprises a DRAM structure.

4. The voltage supply circuitry of claim 3, wherein said first voltage supplying means supplies the memory array power supply $V_{DD}$ to said first inputs of said plurality of word line drivers.

5. The voltage supply circuitry of claim 1, wherein said second voltage supplying means includes means for supplying a second voltage to said word line drivers which is independent of said first voltage when said first voltage is below said predefined transition point.

6. The voltage supply circuitry of claim 5, wherein said second voltage supplying means includes means for supplying a substantially constant second voltage to said word line drivers when said first voltage is below said predefined transition point.

7. In a memory array having a plurality of word lines, each word line being connected to a driver having a first voltage input and a second voltage input, said word line drivers switching between the first voltage input and the second voltage input to perform one of a select and unselect of the corresponding word line, the first voltage input being coupled to receive a power supply voltage, a circuit for generating and supplying a voltage to said second voltage inputs of said word line drivers, said circuit comprising:

means for controllably generating a voltage relative to said power supply voltage such that a maximum stress field across the word line drivers due to a difference between said power supply voltage and said generated voltage is substantially constant irrespective of fluctuations in said power supply voltage; and means for supplying said controllably generated voltage to said second inputs of said word line drivers.

8. The voltage generating and supplying circuit of claim 7, wherein said controllable generating means includes:

a charge reservoir, the voltage charge across said charge reservoir comprising said generated voltage to be supplied to the second voltage inputs of said word line drivers;

a charge pump generator coupled to said charge reservoir, said charge pump generator operating to charge and discharge said reservoir; and means for regulating said charge pump generator such that the difference between said power supply voltage input to said word line drivers and said generated voltage across said charge reservoir is substantially constant irrespective of fluctuations in said power supply voltage.

9. The voltage generating and supplying circuit of claim 8, wherein said memory array comprises a DRAM structure.

10. The voltage generating and supplying circuit of claim 7, wherein said controllable generating means produces said generated voltage so that the maximum stress field across the word line drivers due to the difference between the power supply voltage and the generated voltage is substantially constant when said power supply voltage is above a predefined transition point and wherein said controllable generating means produces a generated voltage which is independent of said power supply voltage when said power supply voltage is below said predefined transition point.

11. The voltage generating and supplying circuit of claim 10, wherein said controllable generating means produces a generated voltage which is substantially constant when said power supply voltage is below said predefined transition point.

* * * * *